(12) United States Patent
Moon et al.

(10) Patent No.: US 9,882,098 B2
(45) Date of Patent: Jan. 30, 2018

(54) LIGHT-EMITTING DEVICE PACKAGE CONTAINING OXYNITRIDE-BASED PHOSPHOR AND LIGHTING APPARATUS CONTAINING SAME

(71) Applicant: LG INNOTEK CO., LTD., Seoul (KR)

(72) Inventors: Ji Wook Moon, Seoul (KR); Bong Kul Min, Seoul (KR); Hyoung Jin Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/309,123

(22) PCT Filed: Mar. 3, 2015

(86) PCT No.: PCT/KR2015/002013
§ 371 (c)(1),
(2) Date: Nov. 4, 2016

(87) PCT Pub. No.: WO2015/182855
PCT Pub. Date: Mar. 12, 2015

(65) Prior Publication Data
US 2017/0077359 A1    Mar. 16, 2017

(30) Foreign Application Priority Data
May 30, 2014  (KR) .................. 10-2014-0066231

(51) Int. Cl.
*H01L 33/50* (2010.01)
*H01L 33/54* (2010.01)
(Continued)

(52) U.S. Cl.
CPC ............ *H01L 33/502* (2013.01); *H01L 33/20* (2013.01); *H01L 33/48* (2013.01); *H01L 33/50* (2013.01);
(Continued)

(58) Field of Classification Search
CPC ....... H01L 33/502; H01L 33/20; H01L 33/48; H01L 33/50; H01L 33/52; H01L 33/54;
(Continued)

(56) References Cited

U.S. PATENT DOCUMENTS

2014/0104874 A1* 4/2014 Park ................... C09K 11/0883
                                                      362/608
2016/0330806 A1* 11/2016 Yamashita ......... H05B 33/0818

FOREIGN PATENT DOCUMENTS

JP    2011-225822    11/2011
JP    2014-039052    2/2014
(Continued)

OTHER PUBLICATIONS

International Search Report (with English translation) and Written Opinion dated Jun. 17, 2015 issued in Application No. PCT/KR2015/002013.

*Primary Examiner* — Cuong Q Nguyen
*Assistant Examiner* — Tong-Ho Kim
(74) *Attorney, Agent, or Firm* — KED & Associates, LLP (57) ABSTRACT

An embodiment provides a light-emitting device package comprising: a first lead frame; a second lead frame; a light-emitting device electrically connected to the first lead frame and the second lead frame; a molding unit arranged to surround the light-emitting device; and an oxynitride-based phosphor represented by chemical formula LXMYOaN-bAcBd:zR ($1 \leq X \leq 3$, $3 \leq Y \leq 7$, $0.001 \leq Z \leq 1.0$, $0 \leq a \leq 5$, $0.1 \leq b \leq 9$, $0.001 \leq c \leq 0.3$, $0.001 \leq d \leq 0.3$), and the light-emitting device package of the present embodiment can implement a white color light having excellent luminance and color rendering index.

12 Claims, 8 Drawing Sheets

(51) Int. Cl.
*H01L 33/20* (2010.01)
*H01L 33/62* (2010.01)
*H01L 33/48* (2010.01)
*H01L 33/52* (2010.01)

(52) U.S. Cl.
CPC .............. *H01L 33/52* (2013.01); *H01L 33/54* (2013.01); *H01L 33/62* (2013.01); *H01L 2224/45144* (2013.01); *H01L 2224/48091* (2013.01); *H01L 2224/48247* (2013.01); *H01L 2924/181* (2013.01)

(58) Field of Classification Search
CPC ........... H01L 33/62; H01L 2224/45144; H01L 2224/48091; H01L 2224/48247; H01L 2924/181
USPC ...................................................... 257/98, 89
See application file for complete search history.

(56) References Cited

FOREIGN PATENT DOCUMENTS

| KR | 10-1196845 | | 11/2012 |
| KR | 10-2013-0000010 | | 1/2013 |
| KR | 1020130000010 A | * | 1/2013 |
| KR | 10-1331392 | | 11/2013 |
| KR | 10-2014-0048431 | | 4/2014 |
| KR | 1020140048431 A | * | 4/2014 |
| WO | WO 2006/025261 | | 3/2006 |

* cited by examiner

Emission Spectrum

LIGHT-EMITTING DEVICE PACKAGE CONTAINING OXYNITRIDE-BASED PHOSPHOR AND LIGHTING APPARATUS CONTAINING SAME

CROSS-REFERENCE TO RELATED PATENT APPLICATIONS

This application is a U.S. National Stage Application under 35 U.S.C. §371 of PCT Application No. PCT/KR2015/002013, filed Mar. 3, 2015, which claims priority to Korean Patent Application No. 10-2014-0066231, filed May 30, 2014, whose entire disclosures are hereby incorporated by reference.

TECHNICAL FIELD

Embodiments relate to a light-emitting device package including an oxynitride-based phosphor and a lighting apparatus including the same.

BACKGROUND ART

A light-emitting device, such as a light-emitting diode or a laser diode, using a group III-V or II-VI compound semiconductor material is capable of emitting various colors, such as red, green, blue, and ultraviolet light, as the result of advances in thin film growth technology and materials for the device. In addition, the light-emitting device may emit white light with high efficiency using a phosphor or by combining colors. Furthermore, the light-emitting device has advantages of lower power consumption, a semi-permanent lifespan, a rapid response time, good safety, and environmental friendliness, when compared to conventional light sources, such as a fluorescent lamp and an incandescent lamp.

White light may be obtained using a single-chip module, in which a phosphor is coupled to a blue or ultraviolet (UV) light-emitting diode chip, or using a multi-chip module including a plurality of chips.

In the multi-chip module, three kinds of chips, namely red, green, and blue (RGB) chips, are combined to obtain white light. In the multi-chip module, however, color coordinates may be changed due to the non-uniformity in operating voltage between the chips or the difference in output between the chips caused by the surroundings.

In the single-chip module, a $Y_3Al_5O_{12}:Ce^{3+}$ (YAG:Ce) phosphor is excited by light emitted by a blue light-emitting diode (LED) to obtain white light. In the case in which the YAG:Ce phosphor is used, however, it is difficult to control a color temperature and a color rendering index (CRI).

DISCLOSURE

Technical Problem

Embodiments provide a light-emitting device package including oxynitride-based phosphor that is capable of emitting white light without the reduction of optical characteristics.

Technical Solution

In one embodiment, a light-emitting device package includes a first lead frame and a second lead frame, a light-emitting device electrically connected to the first lead frame and the second lead frame, a molding unit disposed so as to surround the light-emitting device, and an oxynitride-based phosphor excited by first-wavelength light emitted by the light-emitting device for emitting second-wavelength light, the oxynitride-based phosphor being represented by chemical formula $L_XM_YO_aN_bA_cB_d:zR$ (where $1 \le X \le 3$, $3 \le Y \le 7$, $0.001 \le Z \le 1.0$, $0 \le a \le 5$, $0.1 \le b \le 9$, $0.001 \le c \le 0.3$, and $0.001 \le d \le 0.3$).

The light-emitting device package may further include a package body having a cavity, wherein the first lead frame and the second lead frame may be fixed to the package body, the light-emitting device may be disposed on the bottom surface of the cavity, and the molding part may be disposed in the cavity.

The oxynitride-based phosphor may be contained in the molding part. Alternatively, the oxynitride-based phosphor may be coated on the light-emitting device while in contact with the light-emitting device.

The oxynitride-based phosphor may be a film type phosphor spaced apart from the light-emitting device by a predetermined distance. Alternatively, the oxynitride-based phosphor may be disposed on the surface of the molding part.

L of the oxynitride-based phosphor may include any one selected from the group consisting of Ba, Sr, and Ca, and M of the oxynitride-based phosphor may include any one selected from the group consisting of Si, Ge, and Sn.

A of the oxynitride-based phosphor may include any one selected from the group consisting of Li, Na, and K, and B of the oxynitride-based phosphor may include any one selected from the group consisting of F, Cl, Br, and I.

R of the oxynitride-based phosphor may include at least one selected from among Eu, Mn, Ce, Cr, Tm, Pr, Yb, Dy, Sm, and Tb. In addition, A of the oxynitride-based phosphor may be Li, and B of the oxynitride-based phosphor may be F.

The oxynitride-based phosphor may be represented by chemical formula $Ba_XSi_5O_aN_bLiF:zEu$ (where $0<a<8$, $a+b=8$, $0.01 \le Z \le 0.5$, and $X+Z=2$).

The oxynitride-based phosphor has a central wavelength having an emission peak of 580 nm to 610 nm, and the oxynitride-based phosphor may be excited by light having a wavelength of 300 nm to 550 nm.

The oxynitride-based phosphor may be represented by chemical formula $Ba_XSi_5O_aN_bLi_cF_d:zEu^{2+}$ (where $0<a<8$, $a+b=8$, $0.01 \le Z \le 0.5$, $X+Z=2$, $0.001 \le c \le 0.3$, and $0.001 \le d \le 0.3$).

The light-emitting device may emit blue light or ultraviolet light.

The emission peak of the oxynitride-based phosphor may have a full width at half maximum of 70 nm to 95 nm.

The oxynitride-based phosphor may have a bar shape.

In another embodiment, a lighting apparatus includes the light-emitting device package as a light source.

Advantageous Effects

In the light-emitting device package according to the embodiment and the lighting apparatus including the same, the oxynitride-based phosphor is included, thereby realizing white light having a high color rendering index without the reduction of luminance using blue light or ultraviolet light emitted by the light-emitting device.

BEST MODE

Reference will now be made in detail to embodiments, examples of which are illustrated in the accompanying drawings.

In the following description of the embodiments, it will be understood that, when each element is referred to as being "on" or "under" another element, it can be "directly" on or under another element or can be "indirectly" formed such that an intervening element is also present. In addition, terms such as "on" or "under" should be understood on the basis of the drawings.

Meanwhile, relational terms, such as "first" and "second" and "upper part" and "lower part", are used only to distinguish between one subject or element and another subject or element without necessarily requiring or involving any physical or logical relationship or sequence between such subjects or elements.

In the drawings, the thicknesses or sizes of respective layers are exaggerated, omitted, or schematically illustrated for convenience and clarity of description. Further, the sizes of the respective elements do not denote the actual sizes thereof.

Figure 1:
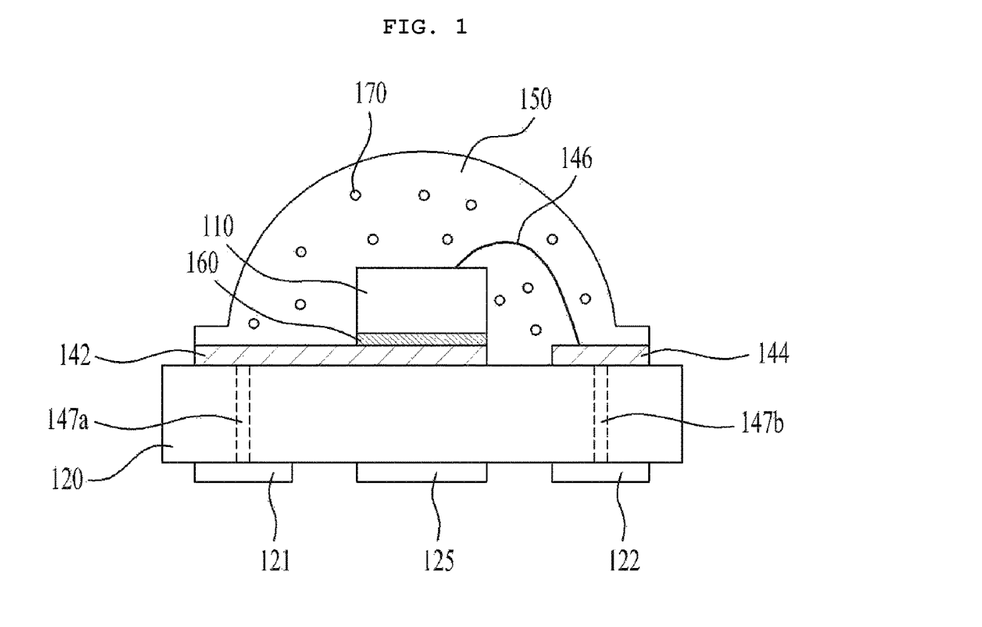
FIG. 1 is a view showing an embodiment of a light-emitting device package.

FIG. 1 is a view showing an embodiment of a light-emitting device package 100.

The light-emitting device package 100 may include a substrate 120, a first lead frame 142 and a second lead frame 144 disposed on the substrate 120, a light-emitting device 110 electrically connected to the first lead frame 142 and the second lead frame 144, a molding unit 150 disposed so as to surround the light-emitting device, and an oxynitride-based phosphor 170, represented by chemical formula $L_xM_yO_aN_bA_cB_d:zR$ ($1 \leq X \leq 3$, $3 \leq Y \leq 7$, $0.001 \leq Z \leq 1.0$, $0 \leq a \leq 5$, $0.1 \leq b \leq 9$, $0.001 \leq c \leq 0.3$, and $0.001 \leq d \leq 0.3$).

The substrate 120 may be formed of a ceramic material exhibiting high thermal conductivity. For example, the substrate 120 may be square sapphire ($Al_2O_3$). The first lead frame 142 and the second lead frame 144 may be formed of a conductive material such as copper. For example, gold (Au) may be plated thereon. The first lead frame 142 and the second lead frame 144 may reflect the light emitted by the light-emitting device 110.

The light-emitting device 110 may be a light-emitting diode.

Figure 2:
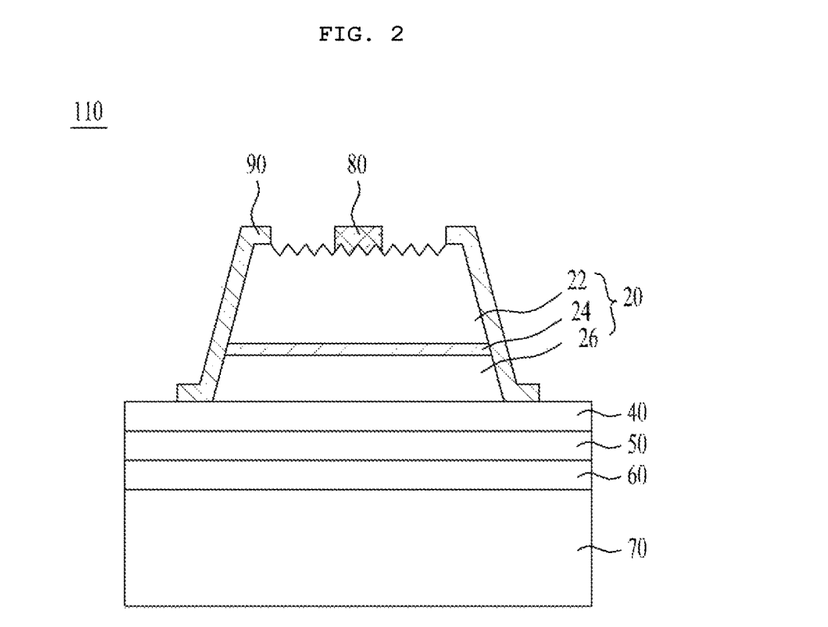
FIG. 2 is a view showing an embodiment of a light-emitting device.

FIG. 2 is a view showing an embodiment of the light-emitting device 110. The light-emitting device 110 may include a support substrate 70, a light-emitting structure 20, an ohmic layer 40, and a first electrode 80.

The light-emitting structure 20 includes a first conductive semiconductor layer 22, an active layer 24, and a second conductive semiconductor layer 26.

The first conductive semiconductor layer 22 may be formed of a group III-V or II-VI compound semiconductor, which may be doped with a first conductive dopant. The first conductive semiconductor layer 22 may be formed of at least one selected from among a semiconductor material having formula $Al_xIn_yGa_{(1-x-y)}N$ (where $0 \leq x \leq 1$, $0 \leq y \leq 1$, and $0 \leq x+y \leq 1$), AlGaN, GaN, InAlGaN, AlGaAs, GaP, GaAs, GaAsP, and AlGaInP.

In the case in which the first conductive semiconductor layer 22 is an n-type semiconductor layer, the first conductive dopant may include an n-type dopant, such as Si, Ge, Sn, Se, or Te. The first conductive semiconductor layer 22 may be a single-layer semiconductor layer or a multi-layer semiconductor layer. However, embodiments are not limited thereto.

The active layer 24 is disposed between the first conductive semiconductor layer 22 and the second conductive semiconductor layer 26. The active layer 24 may include any one selected from among a double hetero structure, a multi well structure, a single quantum well structure, a multi quantum well (MQW) structure, a quantum dot structure, and a quantum wire structure.

The active layer 24 may be formed to have at least one pair structure including a well layer and a barrier layer selected from among AlGaN/AlGaN, InGaN/GaN, InGaN/InGaN, AlGaN/GaN, InAlGaN/GaN, GaAs(InGaAs)/AlGaAs, and GaP(InGaP)/AlGaP using a group III-V compound semiconductor material. However, embodiments are not limited thereto. The well layer may be formed of a material having an energy band gap lower than that of the barrier layer.

The second conductive semiconductor layer 26 may be formed of a compound semiconductor. The second conductive semiconductor layer 26 may be formed of a group III-V or II-VI compound semiconductor, which may be doped with a second conductive dopant. The second conductive semiconductor layer 26 may be formed of at least one selected from among a semiconductor material having formula $In_xAl_yGa_{1-x-y}N$ (where $0 \leq x \leq 1$, $0 \leq y \leq 1$, and $0 \leq x+y \leq 1$), AlGaN, GaN, AlInN, AlGaAs, GaP, GaAs, GaAsP, and AlGaInP. For example, the second conductive semiconductor layer 26 may be formed of $Al_xGa_{(1-x)}N$.

In the case in which the second conductive semiconductor layer 26 is a p-type semiconductor layer, the second conductive dopant may be a p-type dopant, such as Mg, Zn, Ca, Sr, or Ba. The second conductive semiconductor layer 26 may be a single-layer semiconductor layer or a multi-layer semiconductor layer. However, embodiments are not limited thereto.

The surface of the first conductive semiconductor layer 22 may be patterned to improve light extraction efficiency. In addition, the first electrode 80 may be disposed on the surface of the first conductive semiconductor layer 22. Although not shown, the surface of the first conductive semiconductor layer 22, on which the first electrode 80 is disposed, may not be patterned. The first electrode 80 may be formed of at least one selected from among aluminum (Al), chrome (Cr), nickel (Ni), copper (Cu), and gold (Au), and may have a single-layer structure or a multi-layer structure.

A passivation layer 90 may be disposed around the light-emitting structure 20. The passivation layer 90 may be formed of an insulative material, such as a nonconductive oxide or nitride. For example, the passivation layer 90 may be formed of a silicon oxide ($SiO_2$) layer, an oxide nitride layer, or an aluminum oxide layer.

A second electrode may be disposed under the light-emitting structure 20. The ohmic layer 40 and a reflective layer 50 may function as the second electrode. A GaN layer may be disposed under the second conductive semiconductor layer 26 so as to smoothly supply electrons or holes to the second conductive semiconductor layer 26.

The ohmic layer 40 may have a thickness of about 200 Å. The ohmic layer 40 may include at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, and Hf. However, embodiments are not limited thereto.

The reflective layer 50 may be formed of a metal layer including molybdenum (Mo), aluminum (Al), silver (Ag), nickel (Ni), platinum (Pt), rhodium (Rh), or an alloy including Al, Ag, Pt, or Rh. The reflective layer 50 may effectively reflect the light generated from the active layer 24, thereby greatly improving the light extraction efficiency of the semiconductor device.

The support substrate 70 may be formed of a conductive material, such as a metal or a semiconductor material. The support substrate 70 may be formed of a metal exhibiting high electrical conductivity or thermal conductivity. Meanwhile, the support substrate 70 may be formed of a material (e.g. a metal) exhibiting high thermal conductivity such that the support substrate 70 sufficiently dissipates the heat generated during the operation of the semiconductor device. For example, the support substrate 70 may be formed of a material selected from the group consisting of molybdenum (Mo), silicon (Si), tungsten (W), copper (Cu), and aluminum (Al) or an alloy thereof. In addition, the support substrate 70 may selectively include gold (Au), copper alloy (Cu Alloy), nickel (Ni), copper-tungsten (Cu—W), and a carrier wafer (e.g. GaN, Si, Ge, GaAs, ZnO, SiGe, SiC, SiGe, or $Ga_2O_3$).

The support substrate 70 may have sufficient mechanical strength to prevent the entirety of the nitride semiconductor from being bent while allowing the support substrate 70 to be easily cut into individual chips through a scribing process and a breaking process. For example, the support substrate 70 may have a thickness of 50 to 200 μm.

A bonding layer 60 couples the reflective layer 50 to the support substrate 70. The bonding layer 60 may be formed of a material selected from the group consisting of gold (Au), tin (Sn), indium (In), aluminum (Al), silicon (Si), silver (Ag), nickel (Ni), and copper (Cu) or an alloy thereof.

The embodiment of the light-emitting device 110 shown in FIG. 2 is a vertical light-emitting device. However, the light-emitting device package 100 of FIG. 1 may include a horizontal light-emitting device or a flip chip type light-emitting device, in addition to the vertical light-emitting device. The light-emitting device 110 may emit first-wavelength light. The first-wavelength light may be blue light or ultraviolet light.

The light-emitting device 110 may be electrically connected to the second lead frame 144 via a wire 146. The wire 146 may be formed of a conductive material. For example, the wire 146 may be formed of gold (Au), and may have a diameter of 0.8 to 1.6 mm. If the wire 146 is too thin, the wire may be cut by external force. If the wire 146 is too thick, material costs may be increased, and the light emitted by the light-emitting device 110 may be blocked.

In the embodiment of the light-emitting device package 100 of FIG. 1, a molding part 150 may be disposed so as to surround the light-emitting device 110, etc.

The molding part 150 may have a dome shape. The molding part 150 may have another shape so as to adjust the angle at which light exits the light-emitting device 110. The molding part 150 may function as a lens that surrounds the light-emitting device 110 so as to protect the light-emitting device 110 and changes the path of light emitted by the light-emitting device 110.

The molding part 150 may include a resin layer. The resin layer may include a compound including any one selected from among a silicone resin, an epoxy resin, and an acrylic resin or a resin selected from a group including the compound.

The light-emitting device package 100 may include an oxynitride-based phosphor 170 represented by Chemical Formula 1 below.

$$L_XM_YO_aN_bA_cB_d:zR \qquad \text{<Chemical Formula 1>}$$

(where 1≤X≤3, 3≤Y≤7, 0.001≤Z≤1.0, 0≤a≤5, 0.1≤b≤9, 0.001≤c≤0.3, and 0.001≤d≤0.3).

In Chemical Formula 1, L may include any one selected from the group consisting of alkaline-earth metals, such as barium (Ba), strontium (Sr), and calcium (Ca). For example, L may be Ba.

In Chemical Formula 1, M may include any one selected from the group consisting of silicone (Si), geranium (Ge), and tin (Sn). For example, M may be Si.

The oxynitride-based phosphor 170 may be excited by the first-wavelength light emitted by the light-emitting device 110 so as to emit second-wavelength light. In the case in which L in Chemical Formula 1 is Ba, the oxynitride-based phosphor 170 may be phosphor that emits amber-wavelength light.

The light-emitting device package 100 may emit white light through the oxynitride-based phosphor 170, which is excited by blue light or visible light.

The oxynitride-based phosphor 170 represented by Chemical Formula 1 may be excited by blue light or ultraviolet light emitted by the light-emitting device 110. The oxynitride-based phosphor may have a central wavelength having an emission peak of 580 nm to 615 nm.

Table 1 shows the optical characteristics of the oxynitride-based phosphor represented by Chemical Formula 1 and embodiments of the light-emitting device package including the same.

In Table 1, the optical characteristics of the oxynitride-based phosphor included in the light-emitting device package include an emission peak wavelength Wp and a full width at half maximum, and the optical characteristics of the light-emitting device package including the oxynitride-based phosphor include color coordinates and a color rendering index (CRI).

In Table 1, Comparative Example includes a Ca-α-SiAlON phosphor, and Examples 1 and 2 include the oxynitride-based phosphor represented by Chemical Formula 1. In the oxynitride-based phosphor included in Examples 1 and 2, L is Ba, M is Si, R is europium (Eu), A is Li, and B is F. In Examples 1 and 2, the contents of Li and F may be different from each other, and the contents of other components may be equal to each other.

For example, the oxynitride-based phosphor of Example 1 may have 0.05 mol of Li and 0.05 mol of F, and the oxynitride-based phosphor of Example 2 may have 0.2 mol of Li and 0.2 mol of F. That is, the oxynitride-based phosphor of Example 1 may be represented by $Ba_{1.96}Si_5O_{0.1}N_{7.9}Li_{0.05}F_{0.05}{:}_{0.04}Eu$, and the oxynitride-based phosphor of Example 2 may be represented by $Ba_{1.96}Si_5O_{0.1}N_{7.9}Li_{0.2}F_{0.2}{:}_{0.04}Eu$.

Referring to Table 1, the phosphor of Comparative Example has a central wavelength having an emission peak of 595 nm and a full width at half maximum of 85 nm, and the light-emitting device package including the phosphor of Comparative Example has a color rendering index (CRI) of 70.45. The central wavelength having the emission peak shown in Table 1 is excited by light having a wavelength of 450 nm.

The oxynitride-based phosphor of Example 1 has a central wavelength having an emission peak of 585 nm, which is shorter than the central wavelength having the emission peak of the phosphor of Comparative Example. The oxynitride-based phosphor of Example 1 has a full width at half maximum of 72 nm, which is less than the full width at half maximum of the phosphor of Comparative Example. The light-emitting device package including the oxynitride-based phosphor of Example 1 has a color rendering index (CRI) of 64.89 nm, which is lower than the color rendering index (CRI) of the phosphor of Comparative Example.

The oxynitride-based phosphor of Example 2 has a central wavelength having an emission peak of 593 nm and a full width at half maximum of 84 nm, which are similar to those of the phosphor of Comparative Example. The color coordinates and the color rendering index of the light-emitting device package including the oxynitride-based phosphor of Example 2 are similar to those of the light-emitting device package including the phosphor of Comparative Example.

In the oxynitride-based phosphor represented by Chemical Formula 1, the central wavelength having the emission peak may be changed depending on the content ratio of the components. For example, the oxynitride-based phosphor may have a central wavelength having an emission peak of 580 nm to 615 nm.

Referring to the data in Table 1, it can be seen that the optical characteristics of the light-emitting device package including the conventional phosphor, i.e. the Ca-α-SiAlON phosphor, may be realized using the light-emitting device package including the oxynitride-based phosphor represented by Chemical Formula 1, from the fact that the optical characteristics of the oxynitride-based phosphor of Example 2 and the optical characteristics of the light-emitting device package including the same are similar to those of Comparative Example.

TABLE 1

| | Optical characteristics of phosphor | | Optical characteristics of light-emitting device package | | |
|---|---|---|---|---|---|
| | Wp (nm) | Full width at half maximum (nm) | Color coordinate (Cx) | Color coordinate (Cy) | CRI |
| Comparative Example | 595 | 85 | 0.3463 | 0.3695 | 70.45 |
| Example 1 | 585 | 72 | 0.3471 | 0.3661 | 64.89 |
| Example 2 | 593 | 84 | 0.3411 | 0.3573 | 70.55 |

Figure 3A:
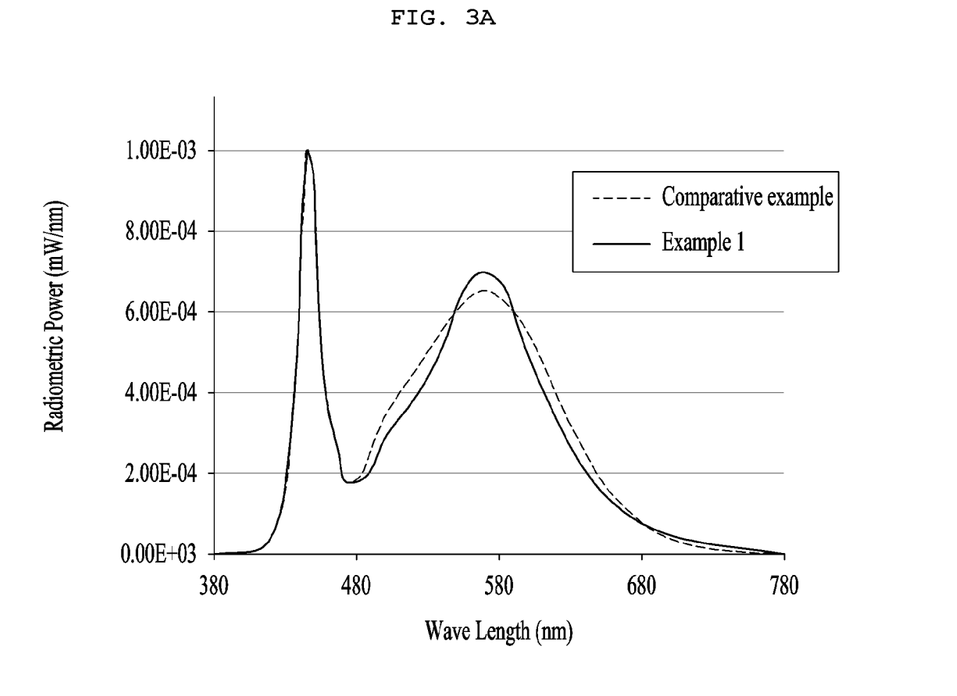
FIGS. 3A and 3B are views showing light-emitting spectra of light-emitting device packages of Comparative Example and Examples.
Figure 3B:
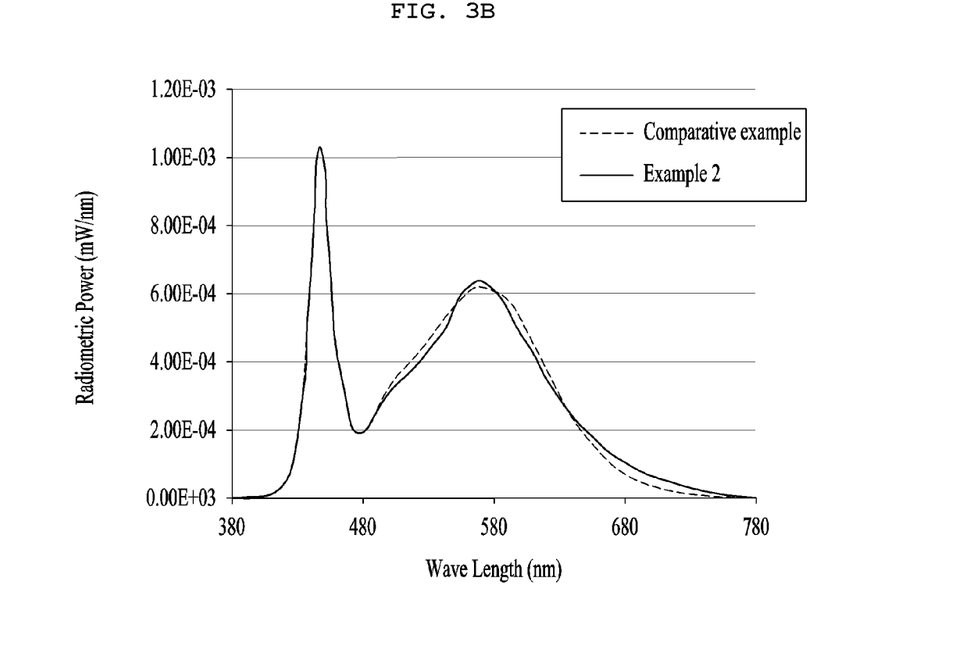

FIGS. 3A and 3B are views showing the light-emitting spectra of the light-emitting device packages of Comparative Example and Examples. FIG. 3A shows the light-emitting spectra of the light-emitting device packages of Comparative Example and Example 1 in Table 1, and FIG. 3B shows the light-emitting spectra of the light-emitting device packages of Comparative Example and Example 2 in Table 1.

Referring to FIGS. 3A and 3B, it can be seen that the light-emitting device packages of Examples 1 and 2 including the oxynitride-based phosphor emit visible light having a wavelength of 480 nm to 780 nm and that the light-emitting device packages of Comparative Example and Examples 1 and 2 emit white light.

Figure 4:
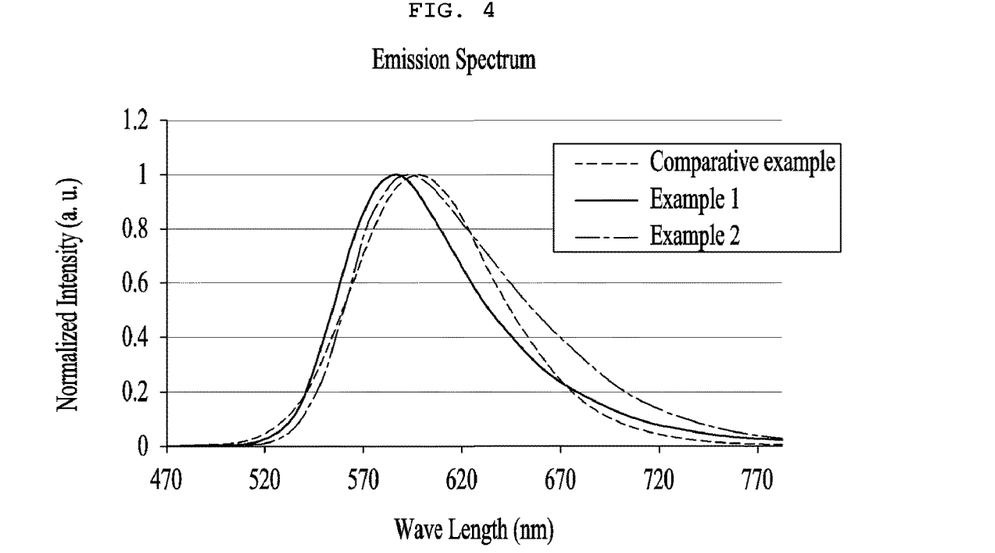
FIG. 4 is a view showing the excitation spectra of oxynitride-based phosphors.

FIG. 4 is a view showing the excitation spectra of the oxynitride-based phosphors.

The oxynitride-based phosphor used in each of Embodiments may be excited by light having a wavelength of 300 nm to 550 nm. For example, referring to FIG. 4, it can be seen that the Ca-α-SiAlON phosphor of Comparative Example and the oxynitride-based phosphors of Examples are excited by light having a wavelength of 350 nm to 550 nm. In particular, it can be seen that the phosphors exhibit relatively high light emission efficiency when excited by blue light having a wavelength of 450 nm or less or by ultraviolet light.

Figure 5:
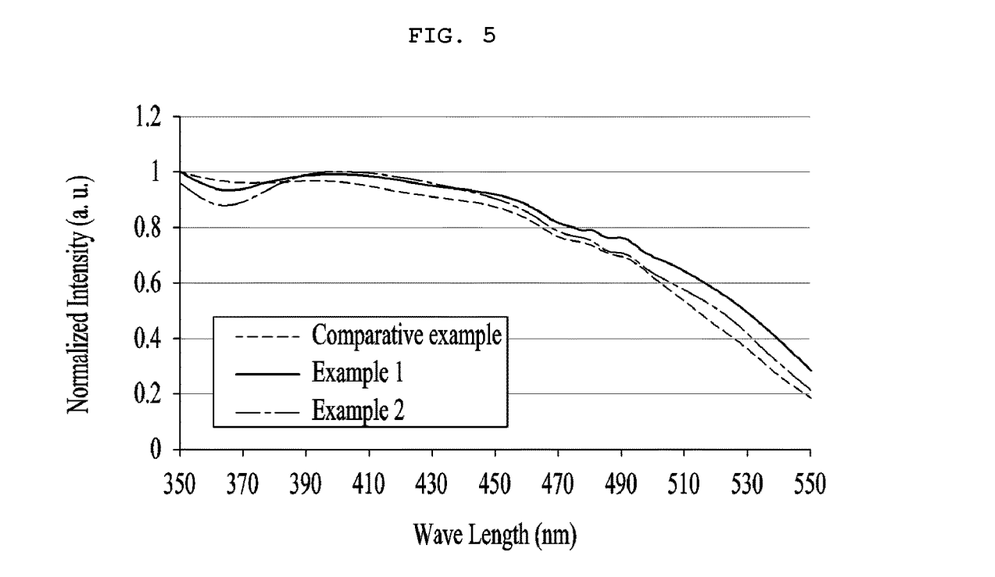
FIG. 5 is a view showing the emission spectra of the oxynitride-based phosphors.

FIG. 5 is a view showing the emission spectra of the oxynitride-based phosphors of Comparative Example and Examples. The oxynitride-based phosphor of Example 1 may have a central wavelength having an emission peak shorter than that of the phosphor of Comparative Example, and the oxynitride-based phosphor of Example 2 may have a central wavelength having an emission peak similar to that of the phosphor of Comparative Example.

Each of the phosphors of Comparative Example and Examples 1 and 2 may have a central wavelength having an emission peak of 500 nm to 750 nm. Each of the phosphors of Comparative Example and Examples 1 and 2 may be an amber phosphor having a central wavelength having an emission peak of 580 nm to 615 nm. In addition, referring to FIG. 5, it can be seen that Example 2, which has a central wavelength having an emission peak similar to that of Comparative Example, has an inner area of the emission peak that is wider than that of Example 2. When considering the above optical characteristics, the oxynitride-based phosphor of Example 2 may have a color rendering index higher than that of Comparative Example.

In the emission spectra of the oxynitride-based phosphors of Examples, the full width at half maximum of the emission peak may be 70 to 95 nm. The full width at half maximum may have an error of ±1 nm.

Referring to FIGS. 4 and 5, the oxynitride-based phosphors of Examples may be excited by the ultraviolet light or blue light emitted by the light-emitting device to emit white light.

In Chemical Formula 1, R may be at least one selected from among alkaline-earth metals, such as europium (Eu), cerium (Ce), samarium (Sm), ytterbium (Yb), dysprosium (Dy), gadolinium (Gd), thulium (Tm), and lutetium (Lu). In the oxynitride-based phosphor, R may be an activator. When the molar concentration of R is increased, the central wavelength having the emission peak of the phosphor may be increased. However, embodiments are not limited thereto.

For example, R may be europium (Eu). The concentration of europium (Eu) may be adjusted to control the emission wavelength of the oxynitride-based phosphor. Europium (Eu) may be included in the form of $Eu^{2+}$.

Table 2 shows the formulae of the embodiments of the oxynitride-based phosphor based on the content of europium (Eu) in the case in which R is europium (Eu). Each of the embodiments in Table 2 may have formula $Ba_{(2-z)}Si_5O_{0.1}N_{7.9}Li_{0.001}F_{0.001}$:$_z$Eu (where $0.001 \leq Z \leq 1.0$).

Table 3 shows the optical characteristics of the embodiments in Table 2. The optical characteristics of the embodiments include emission wavelength spectra and luminance when excited by light having a wavelength of 450 nm. The luminance is a relative value of the luminance of Examples based on the content of europium (Eu) when the luminance of Example 3 is 100%.

Referring to Table 3, the content of europium (Eu) may be adjusted to change the central wavelength of emission of the oxynitride-based phosphor represented by Chemical Formula 1. When the content of europium (Eu) is increased, the central wavelength of emission may be increased. The content of europium (Eu) may be adjusted to realize a phosphor having a central wavelength of 580 to 615 nm. When the content of europium (Eu) is increased, the full width at half maximum of the oxynitride-based phosphor may be increased. The full width at half maximum of the oxynitride-based phosphor may be increased from 71 nm to 107 nm depending on the content of europium (Eu). That is, the oxynitride-based phosphor having a high content of europium (Eu) has a large full width at half maximum. When this oxynitride-based phosphor is applied to a light-emitting device package, therefore, the light-emitting device package may have a high color rendering index.

Among the optical characteristics of the oxynitride-based phosphor, the luminance is increased to a certain percentage when the content of europium (Eu) is increased. When the content of europium (Eu) is further increased, however, the luminance is decreased. Table 2 shows that the relative luminance is maximized when the content of europium (Eu) is 0.02 mol, whereas the luminance is decreased when the content of europium (Eu) is further increased.

TABLE 2

| Classification | Formula |
| --- | --- |
| Example 3 | $Ba_{1.99}Si_5O_{0.1}N_{7.9}Li_{0.001}F_{0.001}$:$_{0.01}$Eu |
| Example 4 | $Ba_{1.98}Si_5O_{0.1}N_{7.9}Li_{0.001}F_{0.001}$:$_{0.02}$Eu |
| Example 5 | $Ba_{1.97}Si_5O_{0.1}N_{7.9}Li_{0.001}F_{0.001}$:$_{0.03}$Eu |
| Example 6 | $Ba_{1.96}Si_5O_{0.1}N_{7.9}Li_{0.001}F_{0.001}$:$_{0.04}$Eu |
| Example 7 | $Ba_{1.95}Si_5O_{0.1}N_{7.9}Li_{0.001}F_{0.001}$:$_{0.05}$Eu |

TABLE 3

| | Luminance (%) | Color coordinate (Cx) | Color coordinate (Cy) | Wp (nm) | Full width at half maximum (nm) |
| --- | --- | --- | --- | --- | --- |
| Example 3 | 100 | 0.520 | 0.467 | 582 | 71 |
| Example 4 | 117.9 | 0.540 | 0.448 | 587 | 77 |
| Example 5 | 108.2 | 0.558 | 0.430 | 595 | 88 |
| Example 6 | 109.7 | 0.578 | 0.410 | 604 | 93 |
| Example 7 | 110.7 | 0.583 | 0.406 | 613 | 107 |

In order to acquire an oxynitride-based phosphor having a desired central wavelength, the content ratio of A to B may be adjusted after optimizing the concentration of R, e.g. Eu. In addition, the content ratio of A to B may be adjusted to control the luminance of the oxynitride-based phosphor.

In the oxynitride-based phosphor represented by Chemical Formula 1, A may be an alkali metal. For example, A may be any one selected from the group consisting of lithium (Li), sodium (Na), and potassium (K).

In the oxynitride-based phosphor represented by Chemical Formula 1, B may be a halogen element. For example, B may be any one selected from the group consisting of fluorine (F), chlorine (Cl), bromine (Br), and indium (I).

A and B may be included in the oxynitride-based phosphor for charge balancing. A and B may have the same molar ratio.

When A and B are included in the oxynitride-based phosphor, the luminance of the oxynitride-based phosphor is improved, compared to the case where A and B are not included in the oxynitride-based phosphor. Consequently, the light emission efficiency of the phosphor is improved. For example, when A is Li and B is F, i.e. when LiF is included in the oxynitride-based phosphor, the luminance of the oxynitride-based phosphor is improved, compared to the case where LiF is not included in the oxynitride-based phosphor.

Figure 6:
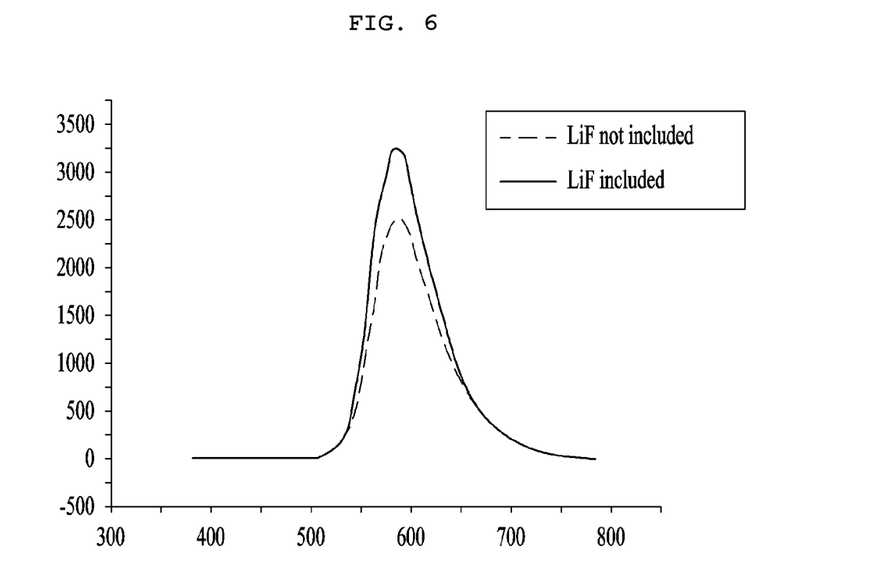
FIG. 6 is a view showing the light-emitting spectra of Comparative Example and Examples.

Table 4 and FIG. 6 show the optical characteristics of the oxynitride-based phosphor when A is Li and B is F, i.e. when LiF is included in the oxynitride-based phosphor. The optical characteristics shown in Table 4 include the luminance and optical characteristic values of the oxynitride-based phosphor when excited by light having a wavelength of 450 nm. The phosphor of the embodiment (including LiF) in Table 4 may have formula $Ba_{1.96}Si_5O_{0.1}N_{7.9}Li_{0.001}F_{0.001}$:$_{0.04}$Eu.

Referring to Table 4, when the luminance of the phosphor not including LiF is 100%, the luminance of the phosphor including LiF is 135.5%. When LiF is included, the emission center peak of the phosphor is changed from 578 nm to 585 nm, and the full width at half maximum is increased to 72 nm.

Consequently, the luminance of the light-emitting device package including the oxynitride-based phosphor having LiF is improved.

TABLE 4

| Classification | Luminance (%) | Color coordinate (Cx) | Color coordinate (Cy) | Wp (nm) | Full width at half maximum (nm) |
| --- | --- | --- | --- | --- | --- |
| LiF not included | 100.0 | 0.516 | 0.471 | 578 | 67 |

TABLE 4-continued

| Classification | Luminance (%) | Color coordinate (Cx) | Color coordinate (Cy) | Wp (nm) | Full width at half maximum (nm) |
|---|---|---|---|---|---|
| LiF included | 135.5 | 0.532 | 0.455 | 585 | 72 |

The luminance and optical characteristic values of the oxynitride-based phosphor included in the light-emitting device package may be changed depending on the content of A and B.

Table 5 shows the formulae of embodiments of the oxynitride-based phosphor based on the content ratio of Li to F. The phosphors of the embodiments in Table 5 may have formula $Ba_{1.96}Si_5O_{0.1}N_{7.9}Li_cF_d:0.04Eu$ (where $0.001 \leq c \leq 0.3$ and $0.001 \leq d \leq 0.3$).

Table 6 shows the optical characteristics of the embodiments of the oxynitride-based phosphor in Table 5. The optical characteristics of the embodiments include emission wavelength spectra and luminance when excited by light having a wavelength of 450 nm. The luminance is a relative value of the luminance of Examples based on the contents of Li and F when the luminance of Example 8 is 100%.

Referring to Table 6, the luminance is increased until the content of each of Li and F is 0.10 mol. When the content of each of Li and F is further increased, however, the luminance may be decreased. The central wavelength having the emission peak of the oxynitride-based phosphor may be increased when the content of each of Li and F is increased. In addition, the full width at half maximum of the oxynitride-based phosphor may also be increased.

TABLE 5

| Classification | Formula |
|---|---|
| Example 8 | $Ba_{1.96}Si_5O_{0.1}N_{7.9}Li_{0.05}F_{0.05}:0.04Eu$ |
| Example 9 | $Ba_{1.96}Si_5O_{0.1}N_{7.9}Li_{0.10}F_{0.10}:0.04Eu$ |
| Example 10 | $Ba_{1.96}Si_5O_{0.1}N_{7.9}Li_{0.15}F_{0.15}:0.04Eu$ |
| Example 11 | $Ba_{1.96}Si_5O_{0.1}N_{7.9}Li_{0.20}F_{0.20}:0.04Eu$ |
| Example 12 | $Ba_{1.96}Si_5O_{0.1}N_{7.9}Li_{0.25}F_{0.25}:0.04Eu$ |
| Example 13 | $Ba_{1.96}Si_5O_{0.1}N_{7.9}Li_{0.30}F_{0.30}:0.04Eu$ |

TABLE 6

| Classification | Luminance (%) | Color coordinate (Cx) | Color coordinate (Cy) | Wp (nm) | Full width at half maximum (nm) |
|---|---|---|---|---|---|
| Example 8 | 100 | 0.536 | 0.452 | 585 | 74 |
| Example 9 | 105.4 | 0.541 | 0.447 | 586 | 76 |
| Example 10 | 98.4 | 0.545 | 0.443 | 586 | 78 |
| Example 11 | 71.0 | 0.557 | 0.431 | 593 | 84 |
| Example 12 | 62.2 | 0.555 | 0.433 | 589 | 92 |
| Example 13 | 75.1 | 0.549 | 0.439 | 588 | 82 |

The oxynitride-based phosphor may have a composition represented by Chemical Formula 2.

$Ba_XSi_5O_aN_bLiF:zEu$        <Chemical Formula 2>

(where $0<a<8$, $a+b=8$, $0.01 \leq Z \leq 0.5$, and $X+Z=2$)

In the above oxynitride-based phosphor, component molecules may be covalently bonded to each other. As the result of covalent bonding, the phosphor may be resistant to thermal vibration. Consequently, a light-emitting device including the oxynitride-based phosphor may exhibit high heat resistance, whereby the light-emitting device may be advantageously applied to a high-output lighting apparatus.

Figure 7:
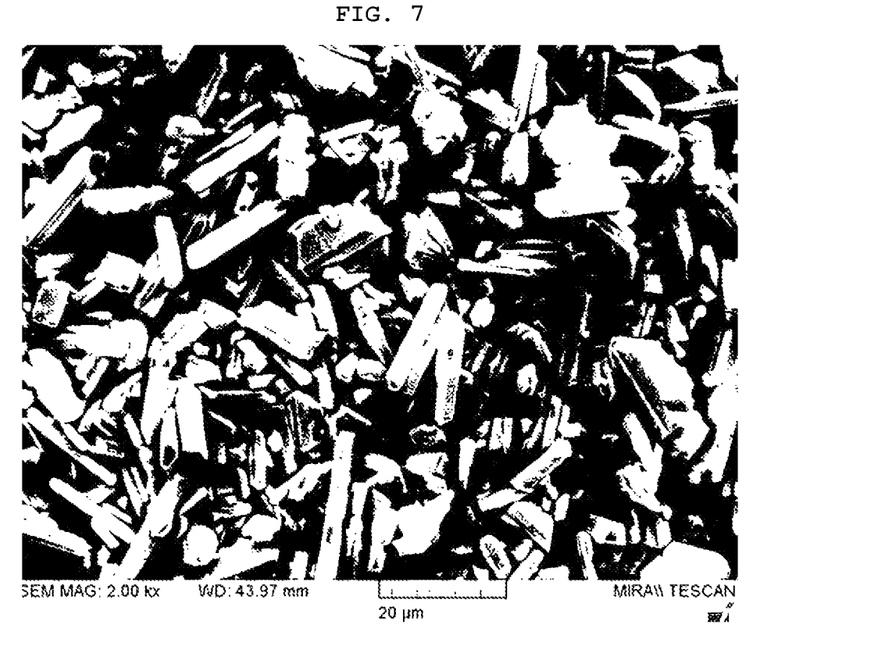
FIG. 7 is a view showing the shape of particles of the oxynitride-based phosphor.

FIG. 7 is a view showing the shape of particles of the oxynitride-based phosphor of the embodiment.

FIG. 7 is a photograph showing the particles of the oxynitride-based phosphor, observed using a scanning electron microscope (SEM). Referring to FIG. 5, the oxynitride-based phosphor of the embodiment may have a bar shape having a size of about 20 µm in the c-axis direction.

The oxynitride-based phosphor may have a crystal structure in which components are arranged according to predetermined rules. For example, the oxynitride-based phosphor may have an orthorhombic crystal structure.

In the embodiment of FIG. 1, the oxynitride-based phosphor 170 may be included in the molding part 150, and may be coated on the light-emitting device 110 while in contact with the light-emitting device 110.

In the light-emitting device package 100 of the embodiment, three pads 121, 122, and 125 may be disposed on the bottom surface of the substrate 120. The pads 121, 122, and 125 may be formed of a material having high thermal conductivity. The pads 121, 122, and 125 may be disposed on the bottom surface of the substrate 120 so as to fix the light-emitting device package 100 to a housing. In addition, the pads 121, 122, and 125 may function as a path for dissipating heat.

The first and second lead frames 142 and 144 and the three pads 121, 122, and 125 may function as electrodes. The first lead frame 142 and the second lead frame 144 may be disposed on the top surface of the substrate 120 to function as upper electrodes, and the first pad 121 and the second pad 122 may be disposed on the bottom surface of the substrate 130 to function as lower electrodes. The upper electrodes and the lower electrodes may be connected to each other through via holes 147a and 147b.

That is, the first lead frame 142 and the second lead frame 144 constitute the upper electrodes, and the first pad 121 and the second pad 122 constitute the lower electrodes. The holes 147a and 147b may be filled with a conductive material to constitute through electrodes. The upper electrodes, the lower electrodes, and the through electrodes may be referred to as first and second electrode units.

The light-emitting device package 100 according to this embodiment includes the oxynitride-based phosphor 170. Consequently, the light-emitting device package 100 may obtain white light from the light-emitting device 110, which emits blue light or ultraviolet light, without reducing the luminous intensity of the light.

Figure 8:
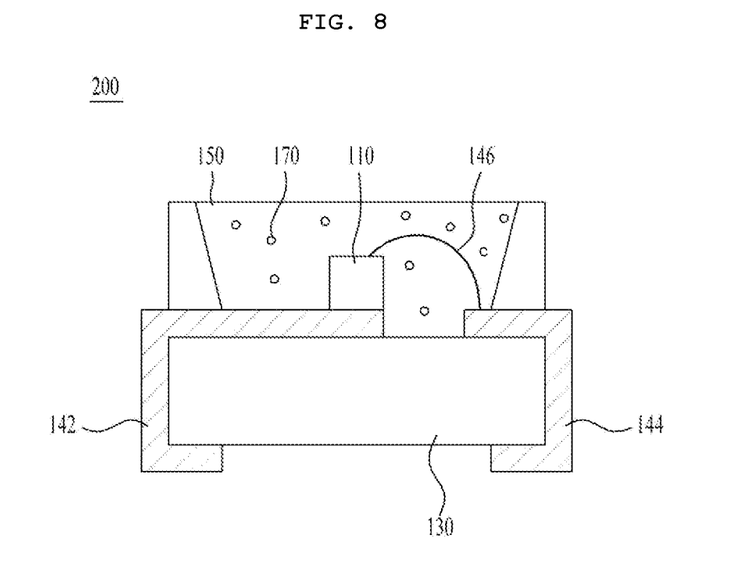
FIG. 8 is a view showing another embodiment of the light-emitting device package.
Figure 9:
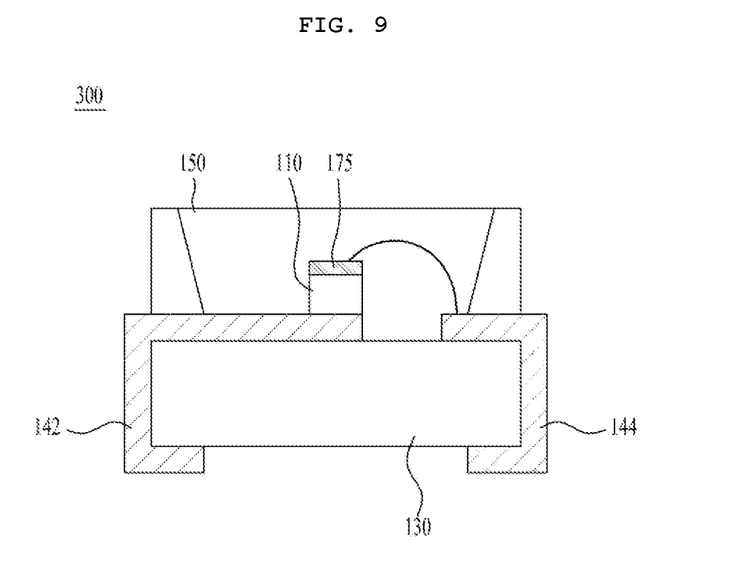
FIG. 9 is a view showing another embodiment of the light-emitting device package.
Figure 10:
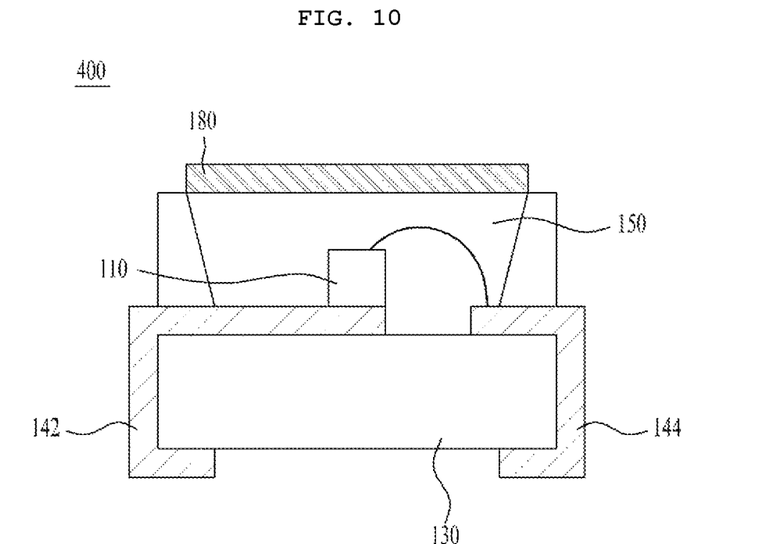
FIG. 10 is a view showing a further embodiment of the light-emitting device package.

FIGS. 8 to 10 are views showing other embodiments of the light-emitting device package.

In the following description, only the differences from the light-emitting device package of FIG. 1 will be described.

The light-emitting device package 200 shown in FIG. 8 may further include a package body 130, to which the first lead frame 142 and the second lead frame 144 are fixed. The package body 130 may have a cavity. The light-emitting device 110 may be disposed on the bottom surface of the cavity. The molding part 150 may be disposed in the cavity.

The body 130 may be formed of a silicone material, a synthetic resin material, or a metal material. The cavity in the body 130 may have an open upper surface, a side surface, and a bottom surface. The cavity may have the shape of a cup or a concave container. The side surface of the cavity may be perpendicular to or oblique to the bottom surface. The cavity may have various sizes and shapes. When viewed from above, the cavity may have a circular, polygonal, or oval shape. In addition, the cavity may have a shape having curved corners. However, embodiments are not limited thereto.

The first lead frame 142 and the second lead frame 144 may be mounted in the body 130 so as to be electrically connected to the light-emitting device 110. In the case in which the body 130 is formed of a conductive material, such as a metal material, the surface of the body 130 may be coated with an insulative layer, although not shown, to prevent electrical short circuits between the first and second lead frames 142 and 144.

The first lead frame 142 and the second lead frame 144 are electrically separated from each other, and supply current to the light-emitting device 110. In addition, the first lead frame 142 and the second lead frame 144 may reflect the light generated by the light-emitting device 110 in order to improve light emission efficiency. Furthermore, the first lead frame 142 and the second lead frame 144 may dissipate the heat generated by the light-emitting device 110 to the outside.

The light-emitting device 110 may be disposed in the cavity, may be disposed on the body 130, or may be disposed on the first lead frame 142 or the second lead frame 144. The light-emitting device 110 may be a vertical light-emitting device or a horizontal light-emitting device. In the embodiment shown in FIG. 7, the light-emitting device 110 may be disposed on the first lead frame 142, and may be connected to the second lead frame 144 via the wire 146. The light-emitting device 110 may be connected to the lead frames by flip-chip boding or die bonding, in addition to wire bonding.

In the embodiment of the light-emitting device package 200 shown in FIG. 8, the molding part 150 may fill the cavity while surrounding the light-emitting device 110. The molding part 150 may include a resin layer and an oxynitride-based phosphor 170. The molding part 150 may surround the light-emitting device 110 so as to protect the light-emitting device 110.

The molding part 150 and the oxynitride-based phosphor 170 may have the same construction as in the embodiment of FIG. 1.

The oxynitride-based phosphor 170 may be mixed in the resin layer such that the oxynitride-based phosphor 170 is distributed in the molding part 150.

The oxynitride-based phosphor 170 may be uniformly distributed in the molding part 150. However, embodiments are not limited thereto. The oxynitride-based phosphor 170 may be distributed such that the density of distribution of the oxynitride-based phosphor 170 in the molding part 150 is gradually increased from the upper part to the lower part of the cavity. Alternatively, oxynitride-based phosphors 170 having different compositional ratios may be used.

The light-emitting device package 200 of the embodiment shown in FIG. 8, including a light-emitting device 110 for emitting blue light or ultraviolet light and an oxynitride-based phosphor 170 having an central wavelength of emission of 580 to 615 nm, may emit white light. The path of the emitted white light may be changed while passing through a lens (not shown).

In addition, although not shown, the molding part 150 may fill the cavity, and may be formed to have a dome shape having a higher height than the side surface of the cavity. The dome shape may be modified to adjust the angle at which light exits the light-emitting device package 200. The molding part 150 may function as a lens that surrounds the light-emitting device 110 so as to protect the light-emitting device 110 and changes the path of the light emitted by the light-emitting device 110.

According to an embodiment of FIG. 9, the oxynitride-based phosphor may be coated on the light-emitting device 110 while in contact with the light-emitting device 110. For example, the oxynitride-based phosphor 170 may be disposed on the light-emitting device 110 by conformal coating so as to form a layer 175 having a predetermined thickness.

The phosphor layer 175 formed by coating may be disposed on the top surface of the light-emitting device 110. However, embodiments are not limited thereto. The phosphor layer 175 may surround the side surface and the top surface of the light-emitting device. The phosphor layer 175 may be formed by partially molding the light-emitting region of the light-emitting device 110. However, embodiments are not limited thereto.

In addition, although not shown, the oxynitride-based phosphor may be disposed on the molding part 150. For example, the surface of the molding part 150 may be coated with the oxynitride-based phosphor 170.

In the light-emitting device package 300 of FIG. 9, first-wavelength light emitted by the light-emitting device 110 passes through the phosphor layer 175 on the light-emitting device, by which the first-wavelength light is converted into second-wavelength light, which may be emitted. The light-emitting device package 300 may emit white light.

In the embodiment of FIG. 9, the oxynitride-based phosphor constituting the phosphor layer 175 may be the same as the oxynitride-based phosphor in the embodiment of the light-emitting device package 100 of FIG. 1. In this embodiment, a vertical light-emitting device is disposed. Alternatively, a horizontal light-emitting device or a flip-chip type light-emitting device may be disposed.

FIG. 10 is a view showing a light-emitting device package 400 according to a further embodiment.

In the light-emitting device package 400 according to this embodiment, the oxynitride-based phosphor may be a film type phosphor that is spaced apart from the light-emitting device 110 by a predetermined distance.

The light-emitting device package 400 shown in FIG. 10 may include a body 130 having a cavity, a light-emitting device 110 disposed in the cavity, a molding part 150 formed in the cavity, and an optical film 180 disposed on the molding part 150. The optical film 180 may include the oxynitride-based phosphor.

The optical film 180 may be disposed on the molding part 150 to transmit the light emitted by the light-emitting device 110.

Figure 11:
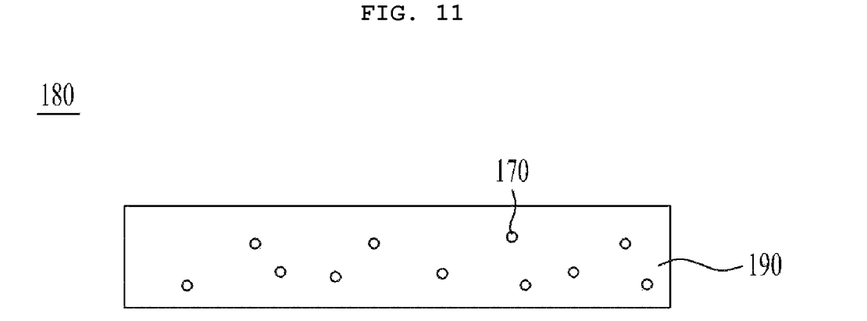
FIG. 11 is a view showing the section of an optical film.

FIG. 11 is a view showing the section of the optical film 180. The optical film 180 may include a base film 190 having a uniform thickness and an oxynitride-based phosphor 170 distributed in the base film 190. According to circumstances, a diffuser or a distributor may be mixed with the oxynitride-based phosphor 170 to constitute the optical film 180.

The base film 190 of the optical film 180 may be formed of a transparent material. For example, the base film 190 may be formed of any one selected from the group consisting of polyethylene, polypropylene, polyethylene terephthalate, polycarbonate, polystyrene, and epoxy compounds. However, embodiments are not limited thereto.

The optical film 180, including the oxynitride-based phosphor 170, may be formed by hardening a raw material used to form the base film 190 in the state in which the oxynitride-based phosphor 170 is distributed in the raw material by extrusion molding or screen printing.

In the case in which the optical film 180, including the oxynitride-based phosphor 170, is disposed on the molding part 150 of the light-emitting device package 400, blue light or ultraviolet light emitted by the light-emitting device 110 may pass through the optical film 180. As a result, the light-emitting device package 400 may emit white light.

In the light-emitting device packages 100, 200, 300, and 400 of the embodiments including the oxynitride-based phosphor, the oxynitride-based phosphor is excited by blue light or ultraviolet light emitted by the light-emitting device 110, with the result that white light may be emitted. In addition, the content ratio of the components constituting the oxynitride-based phosphor may be adjusted to control the optical characteristics, such as the luminance and the color rendering index. In addition, white light having a high color rendering index may be obtained without reducing the luminous intensity of the light, compared to the conventional oxynitride-based phosphor.

Hereinafter, an image display apparatus and a general lighting apparatus, as an embodiment of a lighting system having the above-described light-emitting device package, will be described.

Figure 12:
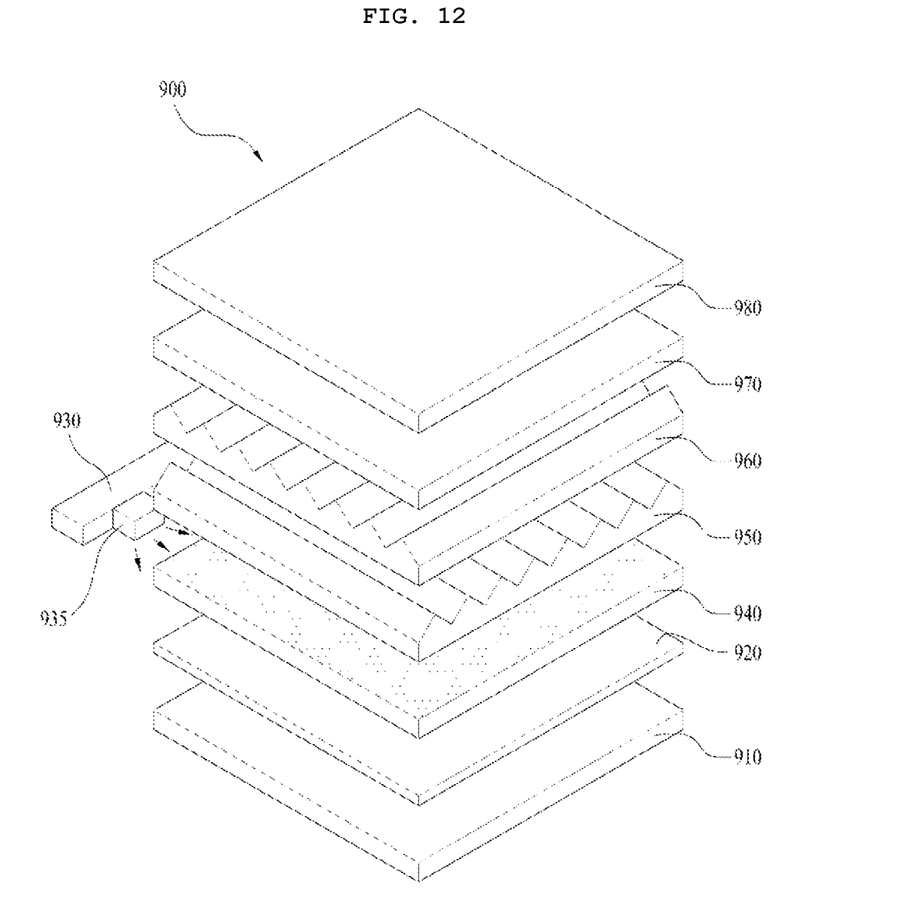
FIG. 12 is a view showing an embodiment of an image display apparatus including a light-emitting device package.

FIG. 12 is a view showing an embodiment of an image display apparatus including a light-emitting device package.

As shown in FIG. 12, an image display apparatus 900 according to this embodiment includes a light source module, a reflective plate 920 on a bottom cover 910, a light guide plate 940 disposed in front of the reflective plate 920 for guiding light emitted from the light source module to the front of the image display apparatus, a first prism sheet 950 and a second prism sheet 960 disposed in front of the light guide plate 940, a panel 970 disposed in front of the second prism sheet 960, and a color filter 980 disposed in front of the panel 970.

The light source module includes a light-emitting device package 935 on a circuit board 930. A printed circuit board (PCB) may be used as the circuit board 930. The light-emitting device package 935 is the same as the light-emitting device package described previously.

In the image display apparatus 900, the edge-type backlight unit shown in FIG. 9 may be used. Alternatively, a direct-type backlight unit may be used.

In the case in which the image display apparatus 900 includes any one of the light-emitting device packages 100, 200, 300, and 400, white light having a high color rendering index may be obtained without reducing the luminous intensity of the light. Consequently, each of the light-emitting device packages 100, 200, 300, and 400 may be used as the light source module of the image display apparatus 900.

Figure 13:
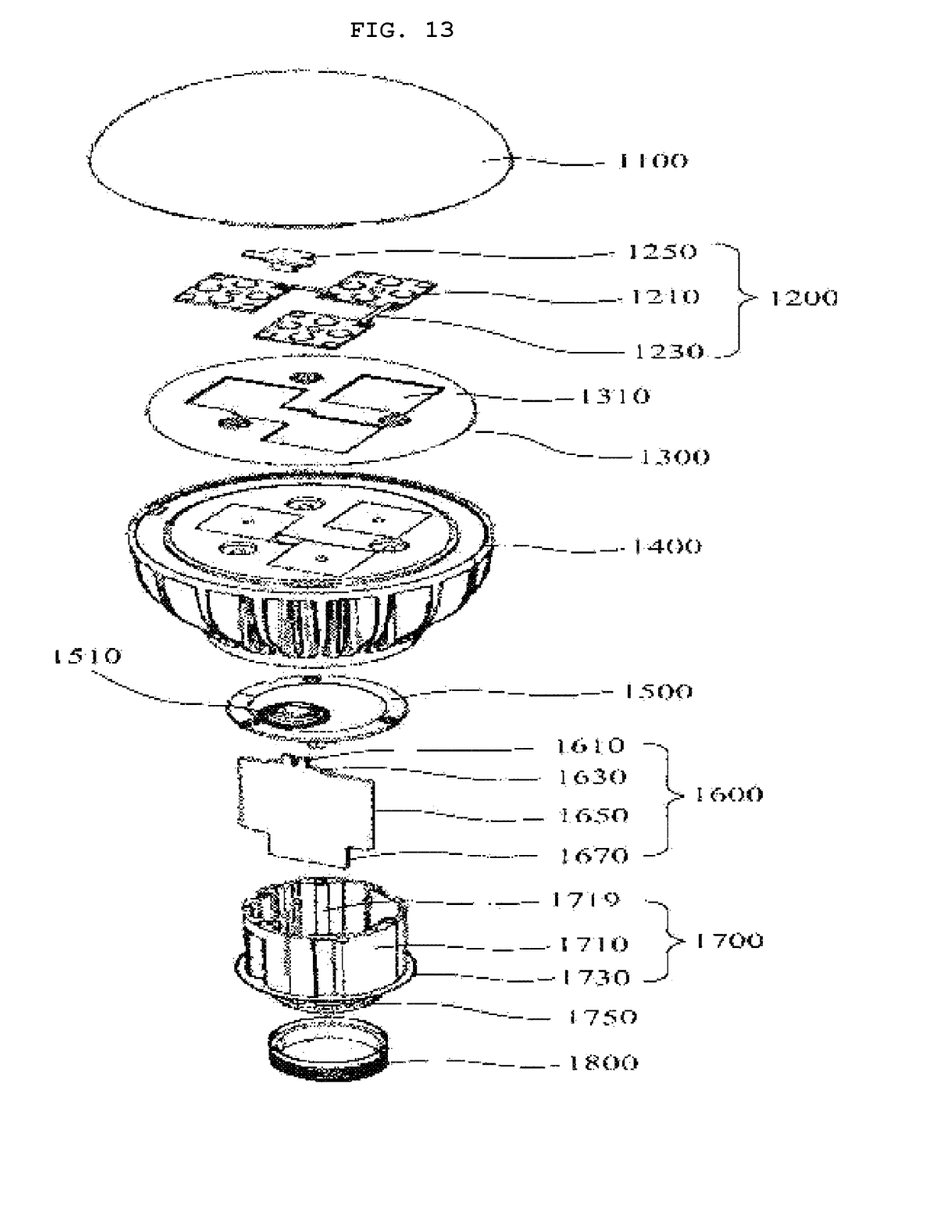
FIG. 13 is a view showing an embodiment of a lighting apparatus including a light-emitting device package.

FIG. 13 is a view showing an embodiment of a lighting apparatus including any one of the light-emitting device packages 100, 200, 300, and 400.

The lighting apparatus according to this embodiment may include a cover 1100, a light source module 1200, a heat sink 1400, a power supply 1600, an inner case 1700, and a socket 1800. In addition, the lighting apparatus may further include at least one selected from between a member 1300 and a holder 1500. The light source module 1200 may include any one of the light-emitting device packages according to the previous embodiments.

The cover 1100 may be formed in the shape of a bulb or a hemisphere. The cover 1100 may be hollow. A portion of the cover 1100 may be open. The cover 1100 may be optically coupled to the light source module 1200. For example, the cover 1100 may diffuse, scatter, or excite the light emitted from the light source module 1200. The cover 1100 may be a kind of optical member. The cover 1100 may be coupled to the heat sink 1400. The cover 1100 may have a coupling part coupled to the heat sink 1400.

The inside of the cover 1100 may be coated with a milky paint. The milky paint may include a diffusion material for diffusing light. The inside of the cover 110 may have surface roughness greater than that of the outside of the cover 1100 such that light emitted from the light source module 1200 can be sufficiently scattered and diffused before exiting outward.

The cover 1100 may be formed of glass, plastic, polypropylene (PP), polyethylene (PE), or polycarbonate (PC). Polycarbonate exhibits high lightfastness, heat resistance, and strength. The cover 1100 may be transparent such that the light source module 1200 is visible from outside the cover, or may be opaque. The cover 1100 may be formed by blow molding.

The light source module 1200 may be disposed at one surface of the heat sink 1400. Consequently, heat generated from the light source module 1200 may be conducted to the heat sink 1400. The light source module 1200 may include light-emitting device packages 1210, a connection plate 1230, and a connector 1250.

A phosphor may be coated on at least one side surface of the cover 1100, or may be disposed in the light-emitting device packages 1210 of the light source module 1200.

The member 1300 is disposed on the top surface of the heat sink 1400. The member 1300 has guide holes 1310, through which the light-emitting device packages 1210 and the connector 1250 are inserted. The guide holes 1310 correspond to substrates of the light-emitting device packages 1210 and the connector 1250.

A light-reflective material may be applied to or coated on the surface of the member 1300. For example, white paint may be applied to or coated on the surface of the member 1300. The member 1300 reflects light reflected by the inside of the cover 1100 and returning to the light source module 1200 such that the light is directed to the cover 1100, thereby improving the light emission efficiency of the lighting apparatus according to the embodiment.

The member 1300 may be formed of an insulative material. The connection plate 1230 of the light source module 1200 may include an electrically conductive material, by which an electrical connection between the heat sink 1400 and the connection plate 1230 may be achieved. The member 1300 may be formed of an insulative material for preventing electrical short circuits between the connection plate 1230 and the heat sink 1400. The heat sink 1400 dissipates the heat generated from the light source module 1200 and the heat generated from the power supply 1600.

The holder 1500 covers a reception recess 1719 of an insulative part 1700 of the inner case 1700. Consequently, the power supply 1600 received in the insulative part 1700 of the inner case 1700 is hermetically sealed. The holder 1500 has a guide protrusion 1510. The guide protrusion 1510 has a hole through which a protrusion 1610 of the power supply 1600 extends.

The power supply 1600 processes or converts an external electrical signal, and supplies the processed or converted signal to the light source module 1200. The power supply 1600 is received in the reception recess 1719 of the inner case 1700, and is hermetically sealed in the inner case 1700 by the holder 1500. The power supply 1600 may further include a guide 1630, a base 1650, and an extension 1670, in addition to the protrusion 1610.

The guide 1630 is formed in a shape protruding outward from one side of the base 1650. The guide 1630 may be inserted into the holder 1500. A plurality of components may be disposed on one surface of the base 1650. The components may include a direct current converter for converting alternating current power, supplied from an external power source, into direct current power, a drive chip for controlling the driving of the light source module 1200, and an electrostatic discharge (ESD) protection device for protecting the light source module 1200. However, embodiments are not limited thereto.

The extension 1670 is formed in a shape that protrudes outward from the other side of the base 1650. The extension 1670 is inserted into a connection part 1750 of the inner case 1700 to receive an external electrical signal. For example, the extension 1670 may have a width equal to or less than that of the connection part 1750 of the inner case 1700. One end of a positive lead and one end of a negative lead may be electrically connected to the extension 1670, and the other end of the positive lead and the other end of the negative lead may be electrically connected to the socket 1800.

A molding part may be disposed in the inner case 1700 in addition to the power supply 1600. The molding part, which is formed by solidifying molding liquid, fixes the power supply 1600 in the inner case 1700.

Each of the light-emitting device packages used in the lighting apparatus according to this embodiment includes the above-described oxynitride-based phosphor. Consequently, it is possible to realize white light having optical characteristics similar to those of the conventional phosphor from a light-emitting device that emits blue light or ultraviolet light without reducing the luminous intensity of the light.

Although embodiments have been described with reference to a number of illustrative embodiments thereof, it should be understood that numerous other modifications and applications may be devised by those skilled in the art that will fall within the intrinsic aspects of the embodiments. More particularly, various variations and modifications are possible in concrete constituent elements of the embodiments. In addition, it is to be understood that differences relevant to the variations and modifications fall within the spirit and scope of the present disclosure defined in the appended claims.

INDUSTRIAL APPLICABILITY

A light-emitting device package according to an embodiment and a lighting apparatus including the same include an oxynitride-based phosphor, thereby realizing white light the optical characteristics of which are not reduced.

The invention claimed is:

1. A light-emitting device package comprising:
    a first lead frame and a second lead frame;
    a light-emitting device electrically connected to the first lead frame and the second lead frame;
    a molding unit provided so as to surround the light-emitting device; and
    an oxynitride-based phosphor excited by first-wavelength light emitted by the light-emitting device for emitting second-wavelength light, the oxynitride-based phosphor being represented by chemical formula $Ba_xSi_5O_aN_bLi_cF_d:zEu^{2+}$ (where $0<a<8$, $a+b=8$, $0.01 \leq Z \leq 0.5$, $X+Z=2$, $0.001 \leq c \leq 0.3$, and $0.001 \leq d \leq 0.3$).

2. The light-emitting device package according to claim 1, further comprising:
    a package body having a cavity, wherein
    the first lead frame and the second lead frame are fixed to the package body,
    the light-emitting device is provided on a bottom surface of the cavity, and
    the molding unit is provided in the cavity.

3. The light-emitting device package according to claim 1, wherein the oxynitride-based phosphor is contained in the molding unit.

4. The light-emitting device package according to claim 1, wherein the oxynitride-based phosphor is coated on the light-emitting device while in contact with the light-emitting device.

5. The light-emitting device package according to claim 1, wherein the oxynitride-based phosphor is provided on a surface of the molding unit.

6. The light-emitting device package according to claim 1, wherein the oxynitride-based phosphor is a film type phosphor spaced apart from the light-emitting device by a predetermined distance.

7. The light-emitting device package according to claim 1, wherein the oxynitride-based phosphor has a central wavelength having an emission peak of 580 nm to 610 nm.

8. The light-emitting device package according to claim 1, wherein the oxynitride-based phosphor is excited by light having a wavelength of 300 nm to 550 nm.

9. The light-emitting device package according to claim 1, wherein the oxynitride-based phosphor has an emission peak having a full width at half maximum of 70 nm to 95 nm.

10. The light-emitting device package according to claim 1, wherein the oxynitride-based phosphor has a bar shape.

11. A light-emitting device package comprising:
    a first lead frame and a second lead frame;
    a light-emitting device electrically connected to the first lead frame and the second lead frame;
    a molding unit provided so as to surround the light-emitting device; and
    an oxynitride-based phosphor excited by first-wavelength light emitted by the light-emitting device for emitting second-wavelength light, the oxynitride-based phosphor being represented by chemical formula $Ba_xM_yO_aN_bLi_cF_d:zEu^{2+}$ (where $0<a<8$, $a+b=8$, $0.01 \leq Z \leq 0.5$, $X+Z=2$, $03 \leq Y \leq 7$, $0.001 \leq c \leq 0.3$, and $0.001 \leq d \leq 0.3$),
    wherein M of the oxynitride-based phosphor comprises any one selected from a group consisting of Ge and Sn.

12. A light-emitting device package comprising:
    a first lead frame and a second lead frame;
    a light-emitting device electrically connected to the first lead frame and the second lead frame;
    a molding unit disposed so as to surround the light-emitting device; and
    an oxynitride-based phosphor excited by first-wavelength light emitted by the light-emitting device for emitting second-wavelength light, the oxynitride-based phosphor being represented by chemical formula $Ba_xSi_5O_aN_bLiF:zEu$ (where $0<a<8$, $a+b=8$, $0.01 \leq Z \leq 0.5$, and $X+Z=2$).

* * * * *